(12) United States Patent
Sugie

(10) Patent No.: US 8,710,878 B2
(45) Date of Patent: Apr. 29, 2014

(54) OUTPUT CIRCUIT

(71) Applicant: Rohm Co., Ltd., Kyoto (JP)

(72) Inventor: Hisashi Sugie, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 13/753,842

(22) Filed: Jan. 30, 2013

(65) Prior Publication Data

US 2013/0141154 A1 Jun. 6, 2013

Related U.S. Application Data

(62) Division of application No. 12/834,924, filed on Jul. 13, 2010, now Pat. No. 8,390,341.

(30) Foreign Application Priority Data

Jul. 13, 2009 (JP) .................................. 2009-164980
Aug. 7, 2009 (JP) .................................. 2009-184859
Jun. 7, 2010 (JP) .................................. 2010-129960

(51) Int. Cl.
*H03B 1/00* (2006.01)

(52) U.S. Cl.
USPC ........................................ 327/112; 327/108

(58) Field of Classification Search
USPC .............................................. 327/108, 112
See application file for complete search history.

(56) References Cited

U.S. PATENT DOCUMENTS

| 5,365,118 A | 11/1994 | Wilcox |
| 7,187,226 B2 | 3/2007 | Audy |
| 8,390,341 B2 * | 3/2013 | Sugie ............................ 327/112 |

FOREIGN PATENT DOCUMENTS

| JP | 2001-160615 A | 6/2001 |
| JP | 2004-119022 A | 4/2004 |
| JP | 2005-304226 A | 10/2005 |
| JP | 2007-209054 A | 8/2007 |

* cited by examiner

*Primary Examiner* — Hai L Nguyen
(74) *Attorney, Agent, or Firm* — Cantor Colburn LLP

(57) ABSTRACT

A low-side off-detection signal compares the gate signal of a low-side transistor with a predetermined first level to generate a low-side off-detection signal indicating that the low-side transistor is off. The low-side detection transistor is of the same type as the low-side transistor, with the source connected to the ground terminal, and the gate receiving the low-side transistor gate signal. A first resistor is arranged between the drain of the low-side detection transistor and the power supply terminal. A first bypass circuit is arranged in parallel with the first resistor, and is configured to switch to the conduction state when a control signal is a level which instructs the low-side transistor to switch off, and to switch to the cut-off state when the control signal level instructs the low-side transistor to switch on. The drain signal of the low-side detection transistor is output as the low-side off-detection signal.

6 Claims, 10 Drawing Sheets

20b

OUTPUT CIRCUIT

CROSS REFERENCE TO RELATED APPLICATIONS

The present application is a divisional application of U.S. patent application Ser. No. 12/834,924, filed on Jul. 13, 2010, the entire contents of which are incorporated herein by reference. The Ser. No. 12/834,924 application claimed the benefit of the dates of the earlier filed Japanese Patent Application Nos. JP 2009-164980, filed Jul. 13, 2009, JP2009-184859, filed Aug. 7, 2009, and JP2010-129960, filed Jun. 7, 2010, priority to which is also claimed herein, and the contents of which are also incorporated by reference herein.

BACKGROUND OF THE INVENTION

1. Field of the Invention

The present invention relates to an output circuit.

2. Description of the Related Art

In electronic circuits, half-bridge circuits and H-bridge circuits (which will be referred to as the "bridge output circuits" hereafter), which employ power transistors, are widely employed. The bridge output circuit includes a high-side transistor and a low-side transistor arranged in series between the power supply terminal and the ground terminal. By alternately switching on and off the high-side transistor and the low-side transistor, such an arrangement outputs either the power supply voltage or the ground voltage via a connection node that connects these two transistors.

With such a bridge output circuit, if the high-side transistor and the low-side transistor are switched on at the same time, shoot-through current flows from the power supply terminal to the ground terminal. In order to prevent such a shoot-through current, a period is established in which both the high-side transistor and the low-side transistor are turned off (which will also be referred to as "dead time") between a state in which the high-side transistor is to be turned on and a state in which the low-side transistor is to be turned on.

By increasing the dead time, such an arrangement reduces the risk of a situation in which the high-side transistor and the low-side transistor are turned on at the same time. However, such an arrangement has a problem of reduced energy efficiency. Furthermore, such increased dead time leads to a problem of the bridge circuit having a reduced response speed, i.e., a problem of reduced switching speed.

RELATED ART DOCUMENTS

Patent Documents

[Patent Document 1]
Japanese Patent Application Laid Open No. 2004-119022
[Patent Document 2]
Japanese Patent Application Laid Open No. 2005-304226
[Patent Document 3]
Japanese Patent Application Laid Open No. 2001-160615
[Patent Document 4]
Japanese Patent Application Laid Open No. 2007-209054

Problem 1. Patent document 2 discloses another method for preventing shoot-through current, which is a different method from the aforementioned method using dead time. With the technique disclosed in Patent document 2, the gate signal for the low-side transistor and the gate signal for the high-side transistor are cross-coupled. Specifically, a logical operation is performed on a control signal for the high-side transistor and the gate signal for the low-side transistor so as to generate the gate signal for the high-side transistor. In the same way, a logical operation is performed on a control signal for the low-side transistor and the gate signal for the high-side transistor so as to generate the gate signal for the low-side transistor.

With such a method, the gate signal of the high-side transistor is monitored, and after it is detected that the high-side transistor has definitely been turned off, the high-side transistor is turned on. In the same way, the gate signal of the low-side transistor is monitored, and after it is detected that the low-side transistor has definitely been turned on, the high-side transistor is turned on. With such a method, the period of time in which both the high-side transistor and the low-side transistor are turned off at the same time can be reduced while preventing shoot-through current. Thus, such an arrangement is advantageous from the viewpoint of energy efficiency.

In order to further improve the operating speed and efficiency, there is a need to monitor the gate signal of the high-side transistor and the gate signal of the low-side transistor, and to detect, at high speed and with high precision, the timing at which each transistor is turned off.

Problem 2. In the field of electronic circuits, half-bridge circuits, H-bridge circuits, and source follower circuits are widely employed. FIG. 7 is a circuit diagram which shows the configuration of a typical half-bridge circuit 200. The half-bridge circuit 200 outputs, via an output terminal POUT, either the power supply voltage Vdd or the ground voltage (0 V), or an intermediate voltage between the two.

The half-bridge circuit 200 includes a high-side transistor M1H and a low-side transistor M1L which each function as a power transistor, and pre-drivers 202 and 204 configured to drive these power transistors. The high-side transistor M1H and the low-side transistor M1L are connected in series between the power supply terminal PVDD and the ground line PGND. The high-side transistor M1H is an N-channel MOSFET (Metal Oxide Semiconductor Field Effect Transistor), and the low-side transistor M1L is a P-channel MOSFET.

The pre-drivers 202 and 204 switch on the high-side transistor M1H and the low-side transistor M1L in a complementary manner according to a control signal S11. When the high-side transistor M1H is switched to the ON state, the output voltage Vout is switched to the power supply voltage Vdd, and when the low-side transistor M1L is switched to the ON state, the output voltage Vout is switched to the ground voltage 0 [V].

The pre-driver 202 of the high-side block supplies, to a control terminal (gate) of the high-side transistor M1H, a gate voltage Vg1 at the high level (Vdd) or the low level (VL) according to the control signal S11. Similarly, the pre-driver 204 of the low-side block supplies, to the gate of the low-side transistor M1L, a gate voltage Vg2 at the high level (VH) or the low level (0 V) according to the control signal S11.

There is a need to determine the electric potential VL of the low level of the gate voltage Vg1 giving consideration to the gate-source breakdown voltage of the high-side transistor M1H. Specifically, the low level voltage VL of the gate voltage Vg1 is designed such that the gate-source voltage (Vdd−VL) does not exceed the gate-source breakdown voltage.

In general, each of the pre-drivers 202 and 204 includes a CMOS inverter. In FIG. 7, the pre-driver 202 includes two transistors M12 and M13 arranged in series between the power supply voltage Vdd and the low-level voltage VL. The low-level voltage VL may be a voltage generated by a constant voltage circuit such as an unshown regulator or the like, or may be the ground voltage.

Description will be made regarding the operation of such an arrangement when the high-side transistor M1H is switched from the OFF state to the ON state.

When the high-side transistor M1H is switched to the OFF state, the pre-driver 202 switches the gate voltage Vg1 of the high-side transistor M1H from high level (Vdd) to low level (VL). Directing attention to the internal configuration of the pre-driver 202, the state of the pre-driver 202 is switched from the state in which the transistor M12 is ON and the transistor M13 is OFF to the state in which the transistor M12 is OFF and the transistor M13 is ON.

Such a transition involves a steep current impulse IM3 flowing through the transistor M13 due to the gate capacitance of the high-side transistor M1H. In this case, when the feedback speed of the constant voltage circuit is insufficient, the low level voltage VL temporarily rises. The increase in the low level voltage VL leads to an increase in the gate voltage Vg1. Accordingly, in this case, the voltage between the gate and source of the high-side transistor M1H becomes lower than a threshold voltage Vt, leading to a malfunction in which the high-side transistor M1H is switched to the OFF state at an unintended timing.

As an approach for resolving this problem, a method is known in which a low performance device is employed as the pre-driver 202. That is to say, a device with a large ON resistance (a small size MOSFET or a bipolar transistor) is employed as the transistor M13. With such an arrangement, the current that flows into the constant voltage circuit via the transistor M13 is limited, thereby suppressing an increase in the low level voltage VL. However, such an approach reduces the switching speed of the high-side transistor M1H, which is a problem.

Such a problem can occur in the low-side transistor M1L. Also, such a problem can occur in an H-bridge circuit or a source follower circuit.

SUMMARY OF THE INVENTION

1. An embodiment of the present invention has been made principally in order to solve the problem 1. Accordingly, it is an exemplary purpose of the present invention to provide a bridge output circuit which is capable of detecting, at high speed, a timing at which a high-side transistor switches off and a timing at which a low-side transistor switches off.

An embodiment of the present invention relates to a bridge output circuit configured to output, via an output terminal, an output signal having a voltage level that corresponds to a control signal. The bridge output circuit comprises: a high-side transistor arranged between a first fixed voltage terminal and the output terminal; a low-side transistor arranged between the output terminal and a second fixed voltage terminal; a low-side off-detection circuit configured to compare a gate signal of the low-side transistor with a predetermined first level so as to detect whether or not the low-side transistor is off, and to generate a low-side off-detection signal which is asserted when it is detected that the low-side transistor is off; a high-side off-detection circuit configured to compare a gate signal of the high-side transistor with a predetermined second level so as to detect whether or not the high-side transistor is off, and to generate a high-side off-detection signal which is asserted when it is detected that the high-side transistor is off; a high-side driver configured to generate the gate signal for the high-side transistor according to the control signal and the low-side off-detection signal; a low-side driver configured to generate the gate signal for the low-side transistor according to the control signal and the high-side off-detection signal. The low-side off-detection circuit comprises: a low-side detection transistor that is of the same type as the low-side transistor, a first terminal of which is connected to the second fixed voltage terminal, and which is configured to receive, via a gate thereof, the gate signal of the low-side transistor; a first resistor arranged between a second terminal of the low-side detection transistor and a third fixed voltage terminal; and a first bypass circuit arranged in parallel with the first resistor, and configured to switch to a conduction state when the control signal is set to a level which instructs the low-side transistor to switch off, and to switch to a cut-off state when the control signal is set to a level which instructs the low-side transistor to switch on. With the low-side off-detection circuit, a signal output via the second terminal of the low-side detection transistor is output as the low-side off-detection signal.

With the first low-side off-detection circuit, before the timing at which the gate signal of the low-side transistor switches from a level which instructs the low-side transistor to switch on, to a level which instructs the low-side transistor to switch off, the first bypass circuit is switched to the conduction state. In this state, the combined resistance connected to the low-side detection transistor is reduced, thereby raising the response speed. Furthermore, when the low-side transistor and the first low-side detection transistor are on, the first bypass circuit is set to a cut-off state. Thus, such an arrangement reduces a current that flows from the second terminal via the low-side detection transistor.

Also, the high-side off-detection circuit may comprise: a high-side detection transistor that is of the same type as the high-side transistor, and arranged such that a first terminal thereof is connected to the first fixed voltage terminal, and the gate signal of the high-side transistor is received via a gate thereof; a second resistor arranged between a second terminal of the high-side detection transistor and a fourth fixed voltage terminal; and a second bypass circuit arranged in parallel with the second resistor, and configured to switch to a conduction state when the control signal is set to a level which instructs the high-side transistor to switch off, and to switch to a cut-off state when the control signal is set to a level which instructs the high-side transistor to switch on. With the high-side off-detection circuit, a signal output via the second terminal of the high-side detection transistor may be output as the low-side off-detection signal.

By employing such a first low-side off-detection circuit, such an embodiment is capable of detecting, at high speed, that the low-side transistor has switched off. Furthermore, such an arrangement reduces power consumption in the first low-side off-detection circuit.

Also, the first bypass circuit may comprise: a first bypass resistor having a smaller resistance value than that of the first resistor; and a first switch arranged in series with the first bypass resistor, and configured to switch on and off according to the control signal.

Also, the second bypass circuit may comprise: a second bypass resistor having a smaller resistance value than that of the second resistor; and a second switch arranged in series with the second bypass resistor, and configured to switch on and off according to the control signal.

2. Another embodiment of the present invention has been made principally in order to solve the problem 2. It is an exemplary purpose of the present invention to provide an output circuit which is capable of switching on and off with high speed.

An embodiment of the present invention relates to an output circuit configured to output, via an output terminal thereof, a voltage that corresponds to a control signal. The output circuit comprises: an output transistor arranged between the output terminal and a first terminal which has a fixed electric potential; a first resistor arranged between a gate of the output transistor and the first terminal; a first ON circuit arranged between the gate of the output transistor and a second terminal which has a fixed electric potential; and a second ON circuit arranged between the gate of the output transistor and a third terminal which has a fixed electric potential. With such an arrangement, when an ON control signal, which instructs the output transistor to switch on, is asserted, both the first and second ON transistors are turned on, following which the first ON transistor is turned off.

With such an embodiment, the current that flows through the first ON transistor and the current that flows through the second ON transistor are combined, and the combined current flows through the first resistor. Thus, after the ON control signal is asserted, the voltage drop that occurs at the first terminal temporarily becomes larger, thereby accelerating the turn-on speed of the output transistor. Subsequently, the first ON transistor is turned off, and accordingly, the current that flows through the first resistor is reduced, thereby reducing the power consumption.

Also, the first ON circuit may comprise a gate voltage monitoring unit configured to monitor the voltage difference between the gate of the output transistor and the first terminal, and to generate an OFF signal which is asserted when the voltage difference thus monitored reaches a predetermined value, thereby turning off the first ON transistor. With such an arrangement, the first ON transistor may be controlled according to the ON control signal and the OFF signal.

Also, the first ON circuit may comprise a delay circuit configured to generate an OFF signal which is asserted after a predetermined period of time elapses after the ON control signal is asserted. With such an arrangement, the first ON transistor may be controlled according to the ON control signal and the OFF signal.

Also, the first ON circuit may comprise a second resistor arranged in series with the first ON transistor.

Also, the second ON transistor may be configured to generate a predetermined constant current when the ON control signal is asserted. With such an arrangement, during a period of time in which the first ON transistor is off and the second ON transistor is on, the gate voltage of the output transistor is stabilized at a voltage represented by Vdd−R1×Ic. Here, Vdd represents the electric potential at the first terminal, R1 represents the resistance value of the first resistor, and Ic represents the value of the constant current.

Also, the output circuit according to an embodiment may further comprise a clamp circuit configured to clamp the voltage difference between the gate of the output transistor and the first terminal to a predetermined value.

By providing such a clamp circuit, such an arrangement is capable of protecting the output transistor.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B.

Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

First Embodiment

Figure 1:
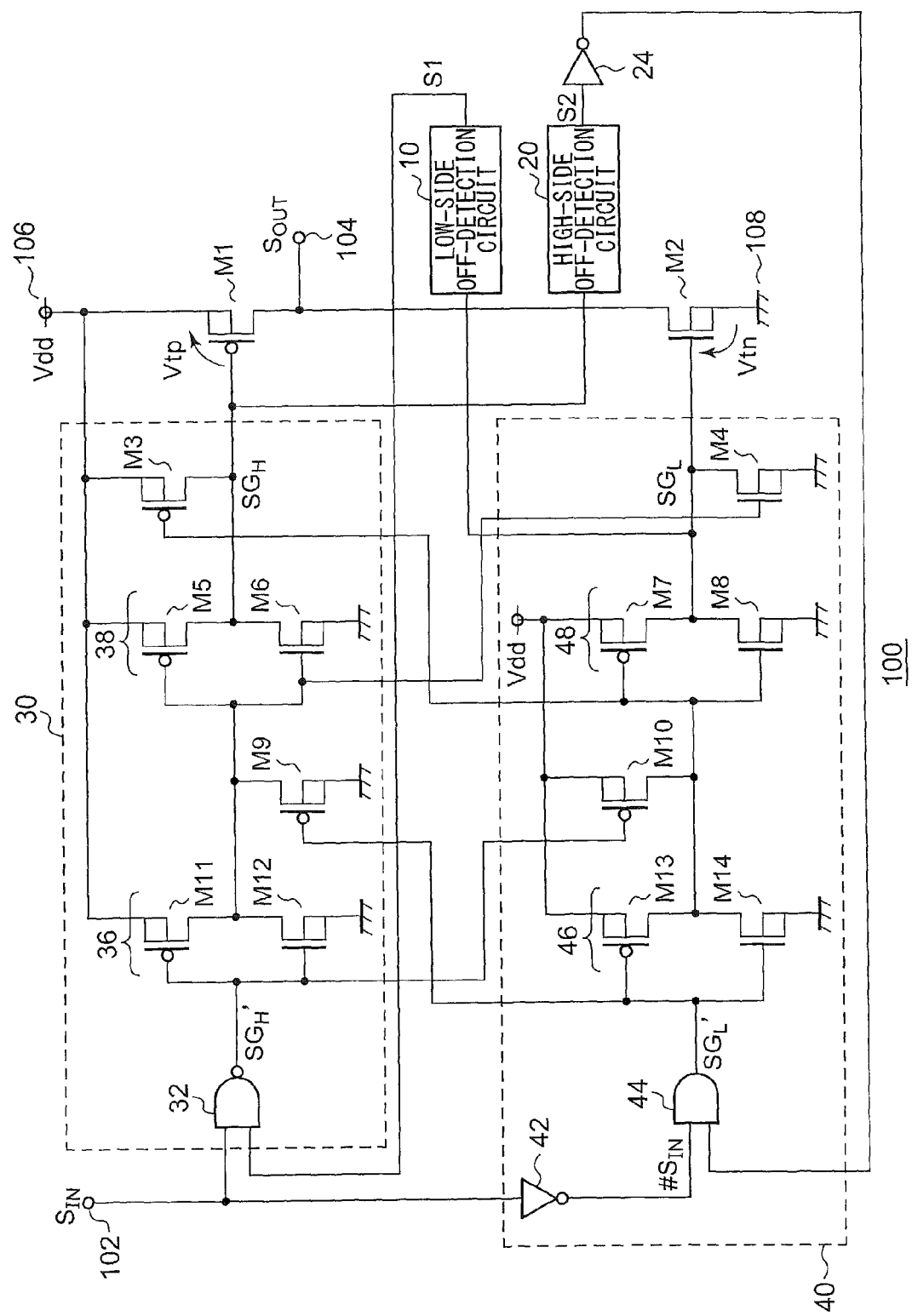
FIG. 1 is a circuit diagram which shows a configuration of a bridge output circuit according to a first embodiment.

FIG. 1 is a circuit diagram which shows a configuration of a bridge output circuit 100 according to a first embodiment. The bridge output circuit 100 receives a control signal SIN via an input terminal 102, and outputs, via an output terminal 104, an output signal SOUT having a voltage level that corresponds to the level of the control signal SIN. With the present embodiment, when the control signal SIN is high level, the output signal SOUT is set to the power supply voltage Vdd, and when the control signal SIN is low level, the output signal SOUT is set to the ground voltage (0 V).

The bridge circuit 100 includes a high-side transistor M1, a low-side transistor M2, a low-side off-detection circuit 10, a high-side off-detection circuit 20, a high-side driver 30, and a low-side driver 40.

The high-side transistor M1 is arranged between a first fixed voltage terminal (power supply terminal 106) and the output terminal 104. The low-side transistor M2 is arranged between the output terminal 104 and the second fixed voltage terminal (ground terminal 108). The high-side transistor M1 and the low-side transistor M2 form a so-called half-bridge circuit.

When the high-side transistor M1 is on and the low-side transistor M2 is off, the output signal SOUT output via the output terminal 104 is set to the power supply voltage Vdd. When the high-side transistor M1 is off and the low-side transistor M2 is on, the output signal SOUT is set to the ground voltage (0 V).

The low-side off-detection circuit 10 compares the voltage level of a gate signal SGL of the low-side transistor M2 with a predetermined first level THL so as to detect whether or not the low-side transistor M2 is off. The low-side off-detection circuit 10 generates a low-side off-detection signal S1 which is asserted (set to high level) when it is detected that the low-side transistor M2 is off.

The high-side off-detection circuit 20 compares the voltage level of a gate signal SGH of the high-side transistor M1 with a predetermined second level THH so as to detect whether or not the high-side transistor M1 is off. The high-side off-detection circuit 20 generates a high-side off-detection signal S2 which is asserted (set to low level) when the high-side off-detection circuit 20 detects that the high-side transistor M1 is off. The inverter 24 inverts the high-side off-detection signal S2. The inverted high-side off-detection signal #S2 ("#" represents logical inversion) is switched to high level at the same time as the high-side transistor M1 is switched to the off state.

The high-side driver 30 generates the gate signal SGH for the high-side transistor M1 based upon the control signal SIN and the low-side off-detection signal S1.

When the control signal SIN is high level and the low-side off-detection signal S1 is asserted (set to high level), the gate signal SGH is set to a level (low level) which turns on the high-side transistor M1. In other cases, the gate signal SGH is set to a level (high level) which turns off the high-side transistor M1.

The high-side driver 30 includes a NAND gate 32, inverters 36 and 38, and transistors M3 and M9.

The NAND gate 32 generates the logical NAND of the control signal SIN and the low-side off-detection signal S1, thereby generating a logical NAND signal SGH'. The inverters 36 and 38 are connected in series, and invert and amplify the output signal SGH' of the NAND gate 32 in sequence. The gate signal SGH is set to the same logical level as that of the output signal of the NAND gate 32. The inverters 36 and 38 each have a typical configuration, and respectively include a pair of transistors M11 and M12 and a pair of transistors M5 and M6.

In order to provide a high-speed operation of turning off the high-side transistor M1, the transistor M3 is arranged between the gate and the source of the high-side transistor M1. When the transistor M3 is turned on, the voltage between the gate and the source of the high-side transistor M1 is set to 0 V, thereby immediately turning off the high-side transistor M1.

The transistor M9 is arranged between the inverters 36 and 38, and is provided in order to allow the electric potential at the connection node which connects the two inverters to be rapidly switched to low level. That is to say, as with the transistor M3, the transistor M9 provides a function of rapidly turning off the high-side transistor M1.

The low-side driver 40 generates the gate signal SGL for the low-side transistor M2 based upon the control signal SIN and the high-side off-detection signal S2.

When the control signal SIN is low level and the high-side off-detection signal S2 is asserted (set to low level), the gate signal SGL is set to a level (high level) which turns on the low-side transistor M2. In other cases, the gate signal SGL is set to a level (low level) which turns off the low-side transistor M2.

The low-side driver 40 includes an inverter 42, an AND gate 44, inverters 46 and 48, and transistors M4 and M10.

The inverter 42 inverts the control signal SIN. The AND gate 44 generates the logical AND of the inverted control signal #SIN and the inverted high-side off-detection signal #S2, thereby generating a logical AND signal SGL'. The inverters 46 and 48 are connected in series, and invert and amplify the output signal SGL' of the AND gate 44 in sequence. The inverters 46 and 48 each have typical configurations, and respectively include a pair of transistors M13 and M14 and a pair of transistors M7 and M8.

In order to provide a high-speed operation of turning off the low-side transistor M2, the transistor M4 is arranged between the gate and the source of the low-side transistor M2. When the transistor M4 is turned on, the voltage between the gate and the source of the low-side transistor M2 is set to 0 V, thereby immediately turning off the low-side transistor M2.

The transistor M10 is arranged between the inverters 46 and 48, which is provided in order to allow the electric potential at the connection node which connects the two inverters to be rapidly switched to high level. That is to say, as with the transistor M4, the transistor M10 provides a function of rapidly turning off the low-side transistor M2.

Figures 2A, 2B:
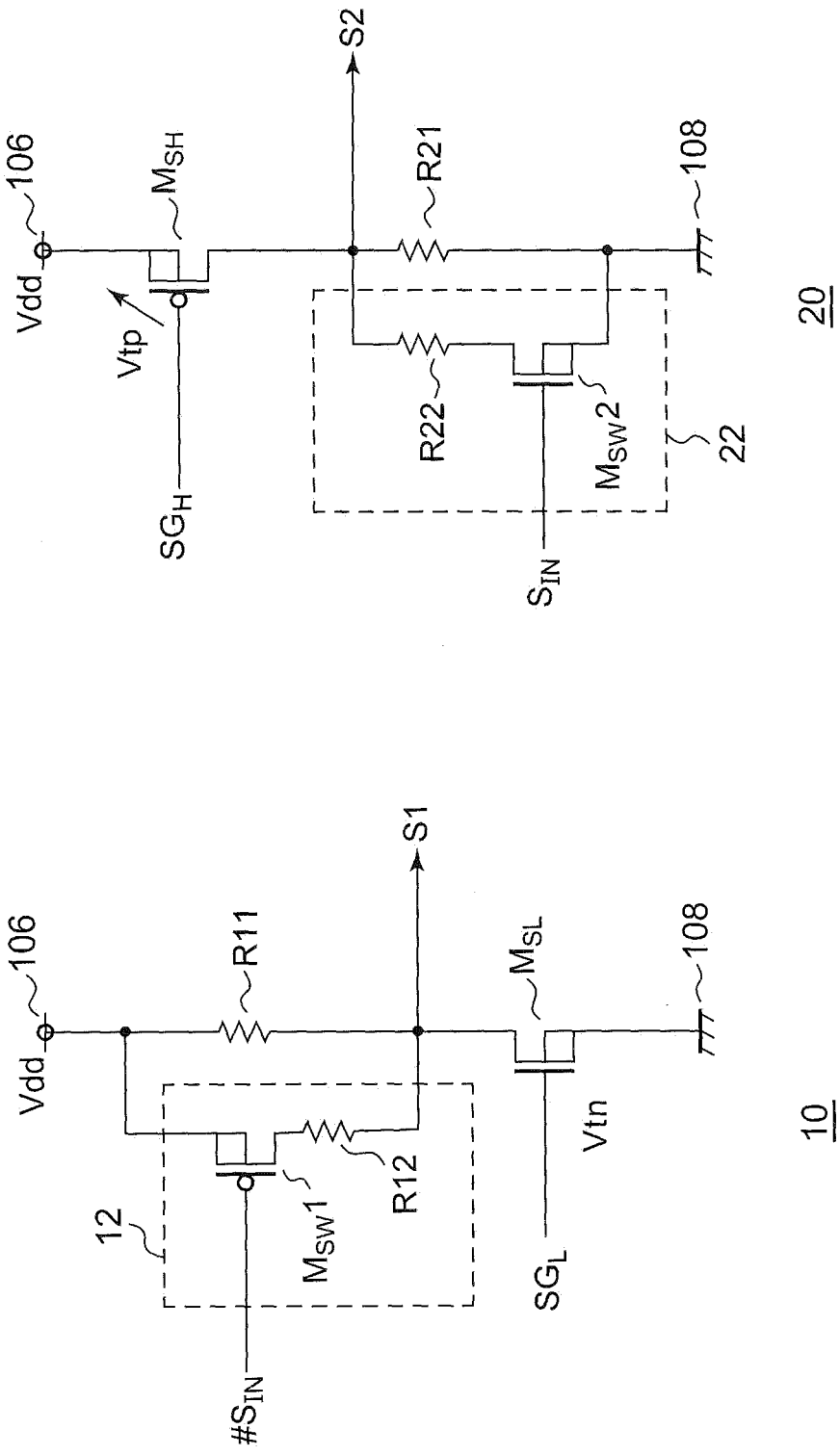
FIGS. 2A and 2B are circuit diagrams which respectively show a low-side off-detection circuit and a high-side off-detection circuit shown in FIG. 1.

FIGS. 2A and 2B are circuit diagrams which respectively show the configurations of the low-side off-detection circuit 10, and the high-side off-detection circuit 20 shown in FIG. 1.

The low-side off-detection circuit 10 shown in FIG. 2A includes a low-side detection transistor MsL, a first resistor R11, and a first bypass circuit 12. The low-side detection transistor MsL is configured as an N-channel MOSFET that is of the same type as the low-side transistor M2. The first terminal (source) of the low-side detection transistor MsL is connected to the second fixed voltage terminal (ground terminal 108), and the gate signal SGL of the low-side transistor M2 is input to the gate of the low-side detection transistor.

The first resistor R11 is arranged between the second terminal (drain) of the low-side detection transistor MsL and a third fixed voltage terminal (power supply terminal 106). The gate-source threshold voltage of the low-side detection transistor MsL corresponds to the aforementioned first level THL, and is preferably the same as the gate-source threshold voltage Vtn of the low-side transistor M2. That is to say, the on and off states of the low-side detection transistor MsL follow the on and off states of the low-side transistor M2.

The first bypass circuit 12 is arranged in parallel with the first resistor R11. When the control signal SIN is set to a level (low level) which instructs the low-side transistor M2 to switch off, the first bypass circuit 12 is switched off. When the control signal SIN is set to a level (high level) which instructs the low-side transistor M2 to switch off, the first bypass circuit 12 is switched on. A resistor component is included on a path of the first bypass circuit 12, the resistance of which is smaller than that of the first resistor R11.

The first bypass circuit 12 includes a first bypass resistor R12 having a smaller resistance value than that of the first resistor R11, and a first switch Msw1 arranged in series with the first bypass resistor R12. The first bypass circuit 12 is switched on and off according to the control signal #SIN.

As the low-side off-detection signal S1, the low-side off-detection circuit 10 outputs the signal output via a second terminal (drain) of the low-side detection transistor MsL.

With the low-side off-detection circuit 10 shown in FIG. 2A, by comparing the voltage level of the gate signal SGL with the first level THL (=Vtn), such an arrangement is capable of detecting whether the low-side transistor M2 is on or off.

The high-side off-detection circuit 20 shown in FIG. 2B includes a high-side detection transistor MsH, a second resistor R21, and a second bypass circuit 22.

The high-side detection transistor MsH is configured as a P-channel MOSFET that is of the same type as the high-side transistor M1. The first terminal (source) of the high-side detection transistor MsH is connected to the first fixed voltage terminal (power supply terminal 106), and the gate signal SGH of the high-side transistor M1 is input to the gate of the high-side detection transistor MsH.

The second resistor R21 is arranged between the second terminal (drain) of the high-side detection transistor MsH and a fourth fixed voltage terminal (ground terminal 108).

The gate-source threshold voltage of the high-side detection transistor MsH corresponds to the aforementioned second level THH, and is preferably the same as the gate-source threshold voltage Vtp of the high-side transistor M1. That is to say, the on and off states of the high-side detection transistor MsH follow the on and off states of the high-side transistor M1.

The second bypass circuit 22 is arranged in parallel with the second resistor R21. When the control signal SIN is set to a level (high level) which instructs the high-side transistor M1 to switch off, the second bypass circuit 22 is switched on. When the control signal SIN is set to a level (low level) which instructs the high-side transistor M1 to switch on, the first bypass circuit 12 is switched off. A resistor component is included on a path of the second bypass circuit 22, the resistance of which is smaller than that of the second resistor R21.

The second bypass circuit 22 includes a second bypass resistor R22 having a smaller resistance value than that of the second resistor R21, and a second switch Msw2 arranged in series with the second bypass resistor R22, and the ON/OFF state of which is switched according to the control signal SIN.

The high-side off-detection circuit 20 outputs, as the high-side off-detection signal S2, a signal output via a second terminal (drain) of the high-side detection transistor MsH. With the high-side off-detection circuit 20 shown in FIG. 2B, by comparing the voltage level of the gate signal SGH with the second level THH (=Vdd−Vtp), such an arrangement is capable of detecting whether the high-side transistor M1 is on or off.

Figure 3:
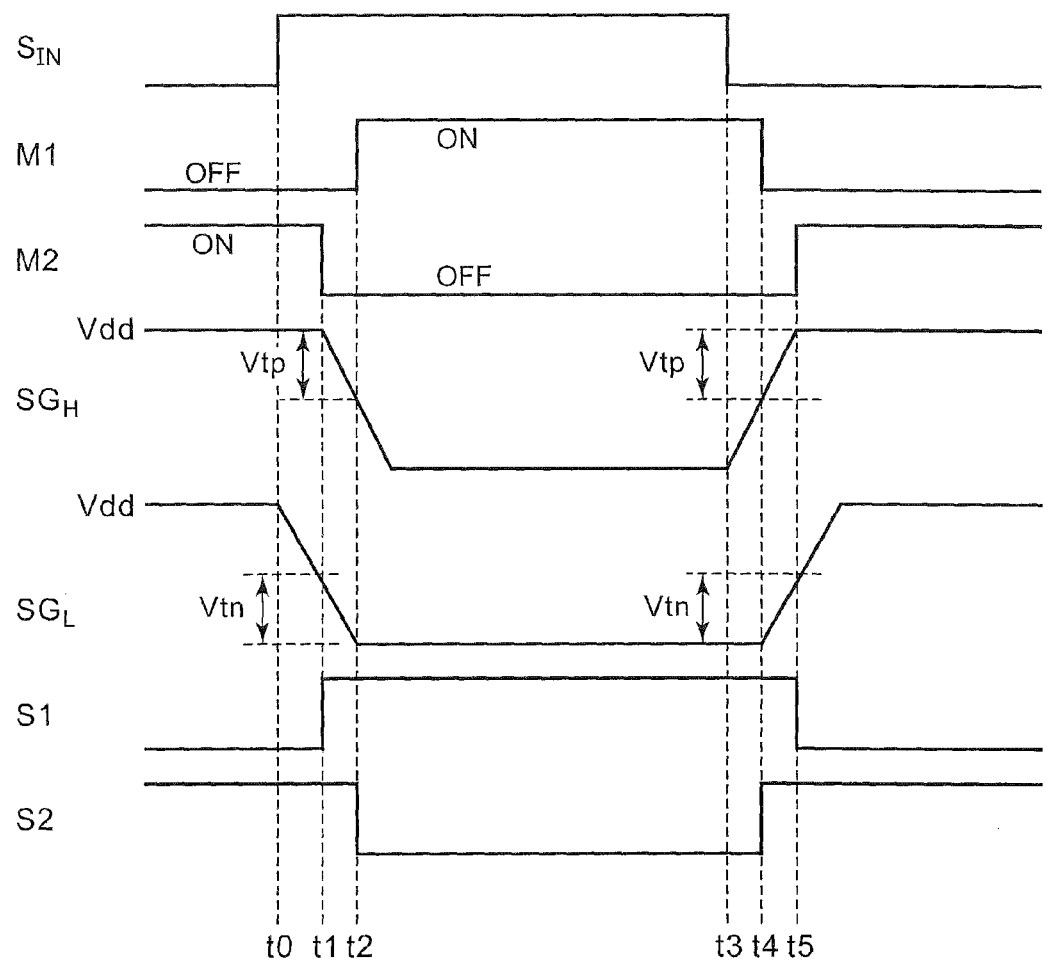
FIG. 3 is a time chart which shows the operation of a bridge output circuit shown in FIG. 1.

Next, description will be made regarding the operation of the bridge output circuit 100. FIG. 3 is a time chart which shows the operation of the bridge output circuit 100 shown in FIG. 3. Before the time point t0, the control signal SIN is low level, the high-side transistor M1 is off, and the low-side transistor M2 is on.

At the time point t0, the control signal SIN is switched from low level to high level, which instructs the high-side transistor M1 to switch on and the low-side transistor M2 to switch off.

When the control signal SIN has been switched on, the gate signal SGL of the low-side transistor M2 is switched from high level (Vdd) to low level (0 V). When the voltage level of the gate signal SGL becomes lower than the threshold voltage Vtn at the time point t1, the low-side transistor M2 is turned off, and the low-side off-detection signal S1 is asserted by the low-side off-detection circuit 10.

When the low-side off-detection signal S1 is asserted, the gate signal SGH of the high-side transistor M1 starts to switch from high level (Vdd) to low level (0 V). When the voltage level of the gate signal SGH becomes lower than the second threshold value THH (=Vdd−Vtp) at the time point t2, the high-side transistor M1 is turned on.

At the time point t3, the control signal SIN is switched from high level to low level, which instructs the high-side transistor M1 to switch off and the low-side transistor M2 to switch on. In the period between the time points t3 and t5, similar processing is executed by the high-side off-detection circuit 20 in the same way as in the period between the time points t0 and t2.

The above is the operation of the bridge output circuit 100.

With the bridge output circuit 100, the period between the time points t1 and t2 and the period between the time points t4 and t5 each function as dead time during which the high-side transistor M1 and the low-side transistor M2 are simultaneously off.

With the low-side off-detection circuit 10 and the high-side off-detection circuit 20 shown in FIGS. 2A and 2B, transition from on to off can be detected at high speed with respect to the low-side transistor M2 and the high-side transistor M1. Thus, such an arrangement enables the dead time to be reduced, thereby improving the circuit efficiency.

The low-side off-detection circuit 10 is a circuit configured to detect the switching from on to off of the low-side transistor M2. Accordingly, the low-side off-detection circuit 10 preferably has the following characteristics.

[Characteristic 1]

The low-side off-detection circuit 10 operates at high speed during a period in which the low-side transistor M2 is on.

[Characteristic 2]

The low-side off-detection circuit 10 does not need to operate during a period in which the low-side transistor M2 is off. Accordingly, the power consumption of the low-side off-detection circuit 10 is preferably small during the period in which the low-side transistor M2 is off.

With the low-side off-detection circuit 10 shown in FIG. 2A, during a period in which the control signal #SIN is high level (SIN is low level), i.e., during a period in which the low-side transistor M2 is off, the first switch Msw1 is off. Thus, such an arrangement reduces the current flowing from the power supply terminal 106 to the ground terminal 108 in the low-side off-detection circuit 10. That is to say, such an arrangement provides the advantage noted above as "characteristic 2".

Furthermore, during a period in which the control signal #SIN is low level (SIN is high level), i.e., during a period in which the low-side transistor M2 is on, the first switch MsW1 is also on. Accordingly, the impedance of the load connected to the drain of the low-side detection transistor MsL becomes low, thereby raising the response speed of the low-side off-detection circuit 10. That is to say, such an arrangement provides the advantage noted above as "characteristic 1".

The high-side off-detection circuit 20 is a circuit configured to detect the switching from on to off of the high-side transistor M1 *f*. Accordingly, the high-side off-detection circuit 20 preferably has the following characteristics.

[Characteristic 3]

The high-side off-detection circuit 20 operates at high speed during a period in which the high-side transistor M1 is on.

[Characteristic 4]

The high-side off-detection circuit 20 does not need to operate during a period in which the high-side transistor M1 is off. Accordingly, the power consumption of the high-side off-detection circuit 20 is preferably small during the period in which the high-side transistor M1 is off.

The high-side off-detection circuit 20 shown in FIG. 2B provides the characteristics 3 and 4.

Furthermore, in FIG. 1, the output impedance (ON resistance R) of each transistor preferably satisfies the following relations. Each index number represents the identification number of the corresponding transistor.

$$RM3 < RM6$$

$$RM9 < RM11$$

$$RM4 < RM7$$

$$RM10 < RM14$$

By determining the size of each transistor such that the aforementioned relations are satisfied, such an arrangement is capable of preventing, in a surer manner, a state in which the high-side transistor M1 and the low-side transistor M2 are simultaneously on.

[Modification]

Figure 4:
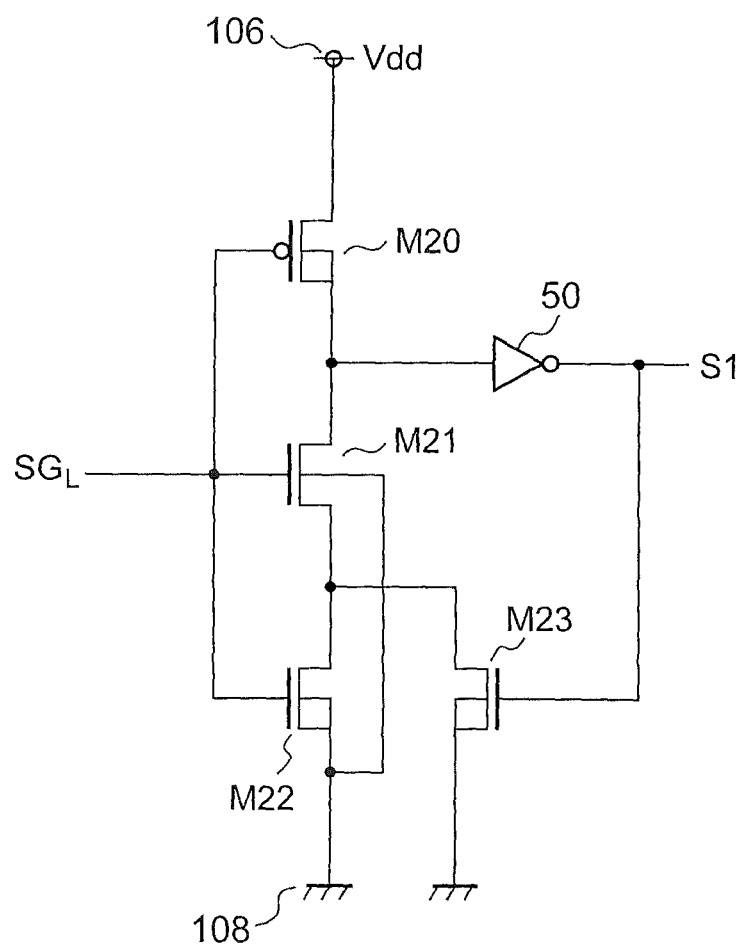
FIG. 4 is a circuit diagram which shows a configuration of a low-side off-detection circuit according to a modification.

FIG. 4 is a circuit diagram which shows a configuration of a low-side off-detection circuit 10a according to a modification.

The low-side off-detection circuit 10a includes transistors M20 through M23, and an inverter 50. The transistors M21 through M23 are each configured as a transistor that is of the same type (N-channel MOSFET) as the low-side transistor M2. The transistor M22 is configured as a P-channel MOSFET.

The transistors M20 through M22 are connected in order in series between the power supply terminal 106 and the ground terminal 108. The gate signal SGL of the low-side transistor M2 is input to the gates of the transistors M20 through M22. The inverter 50 inverts a signal output via a connection node that connects the transistor M20 and M21, and outputs the signal thus inverted as the low-side off-detection signal S1. The transistor M23 is arranged in parallel with the transistor M22. The low-side off-detection signal S1 is input to the gate of the transistor M23. The low-side off-detection circuit 10a compares the gate signal SGL with the first threshold value THL, and generates the low-side off-detection according to the comparison results.

With the low-side off-detection circuit 10a, the dead time can be reduced in the same way as with the low-side off-detection circuit 10 shown in FIG. 2A, thereby improving energy efficiency. Furthermore, by adjusting the gate length and the gate width of each transistor, the low-side off-detection circuit 10a allows the first threshold value THL to be adjusted. Furthermore, such an arrangement allows the first threshold value THL to have hysteresis characteristics, thereby improving noise resistance.

The high-side off-detection circuit 20 according to a modification can be configured by replacing the P-channel MOSFET with an N-channel MOSFET, and by inverting the arrangement of the power supply terminal 106 and the ground terminal 108, which can be conceived by those skilled in this art.

Figure 5:
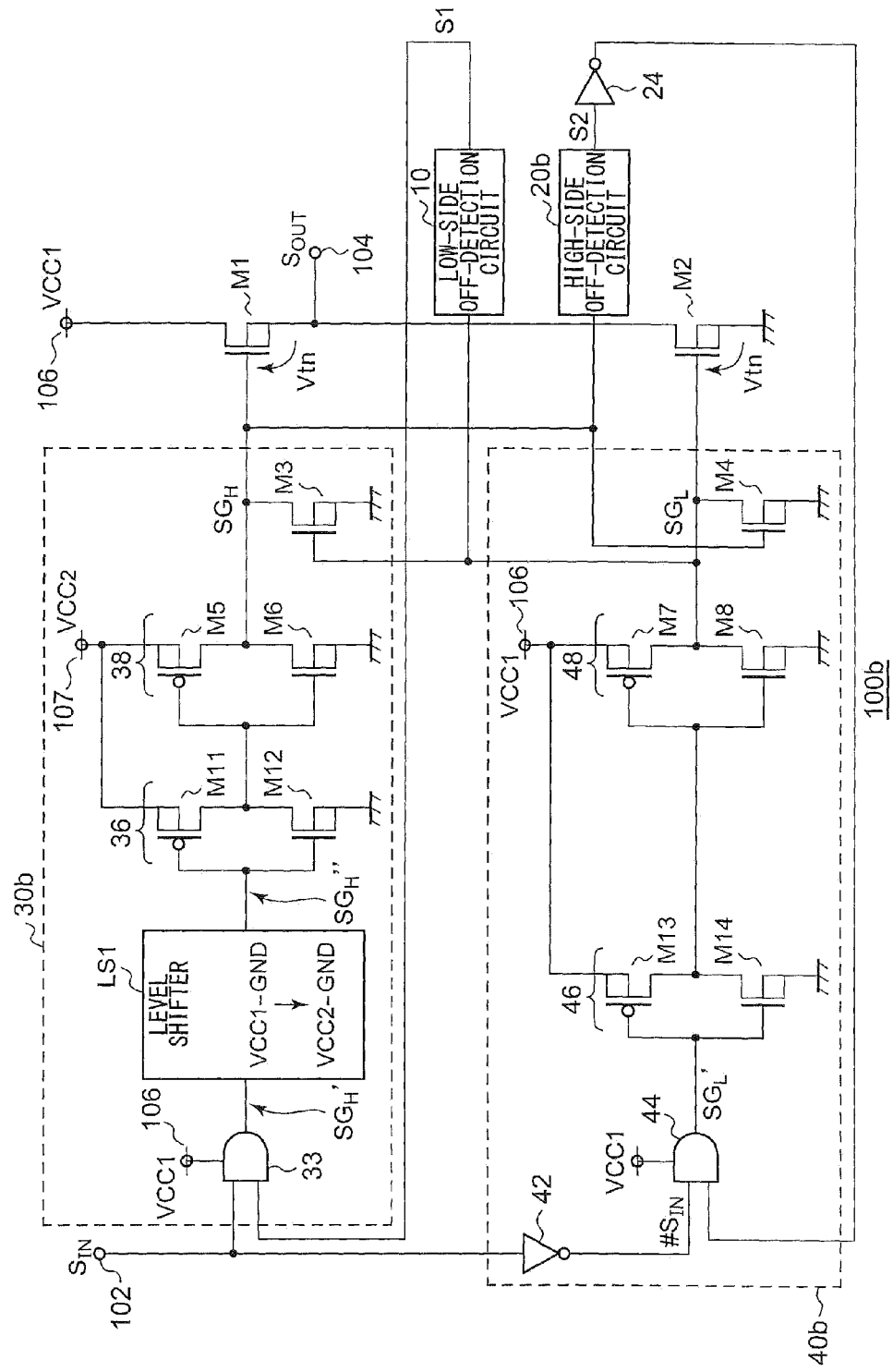
FIG. 5 is a circuit diagram which shows a configuration of a bridge output circuit according to a modification.

FIG. 5 is a circuit diagram which shows a configuration of a bridge output circuit 100b according to a modification. Description will be made regarding the bridge output circuit 100b shown in FIG. 5, focusing on how it differs from the bridge output circuit 100 shown in FIG. 1.

The high-side transistor M1 shown in FIG. 1 is configured as a P-channel MOSFET. In contrast, the high-side transistor M1 shown in FIG. 5 is configured as an N-channel MOSFET.

The bridge output circuit 100b shown in FIG. 5 includes two power supply terminals 106 and 107, via which power supply voltages VCC1 and VCC2 are supplied. It should be noted that VCC1>VCC2.

The low-side block has the same configuration as that of the low-side block shown in FIG. 1.

In order to turn on the high-side transistor M1 configured as an N-channel MOSFET, the gate signal SGH to be applied to the gate of the high-side transistor M1 must be set to a higher electric potential than (VCC1+Vtn). Here, Vtn represents the gate-source threshold voltage of the high-side transistor M1. A high-side driver 30b generates the gate signal SGH, which is set to the power supply voltage VCC2 when the high-side transistor M1 is to be turned on, and which is set to the ground voltage (0 V) when the high-side transistor M1 is to be turned off. That is to say, the relation VCC2>VCC1+Vtn is satisfied.

An AND gate 33 generates the logical AND of the control signal SIN and the low-side off-detection signal S1, thereby outputting a logical AND signal SGH'. The logical AND signal SGH' is set to either VCC1 or 0 V.

A level shifter circuit LS1 converts the gate signal SGH', which switches between VCC1 and 0 V, into a gate signal SGH" which switches between VCC2 and 0 V. The power supply voltage VCC2 is supplied to the inverters 36 and 38. The inverters 36 and 38 invert the gate signal SGH" in sequence.

Figure 6:
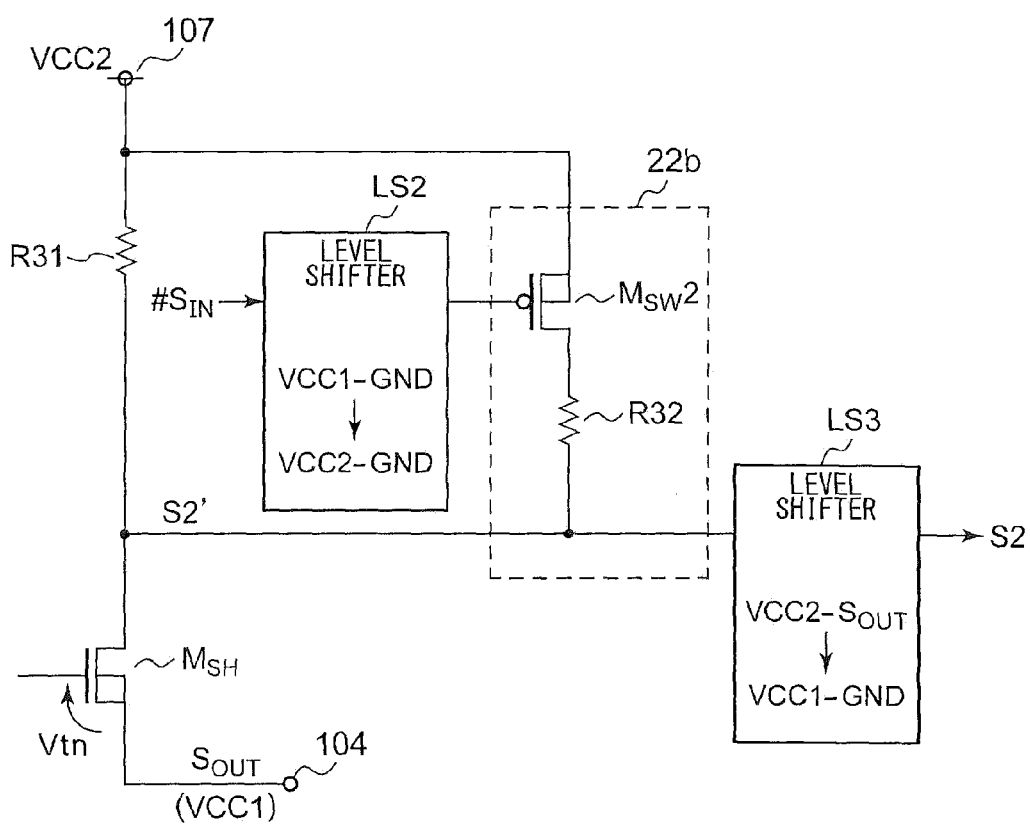
FIG. 6 is a circuit diagram which shows an example configuration of a high-side off-detection circuit shown in FIG. 5.
Figure 7:
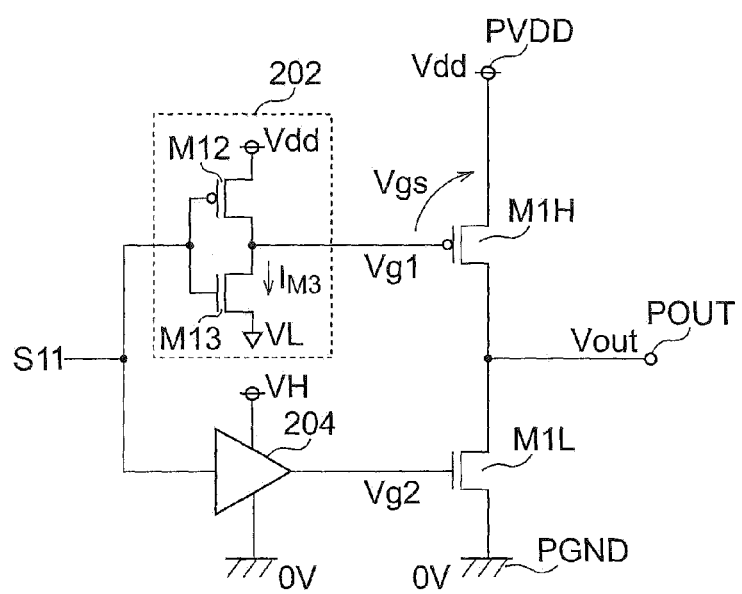
FIG. 7 is a circuit diagram which shows a configuration of a typical half-bridge circuit.

FIG. 6 is a circuit diagram which shows an example configuration of a high-side off-detection circuit 20b shown in FIG. 5.

The high-side off-detection circuit 20b includes a high-side detection transistor MsH, a second resistor R31, and a second bypass circuit 22b.

The high-side detection transistor MsH is configured as an N-channel MOSFET which is of the same type as the high-side transistor M1. The first terminal (source) of the high-side detection transistor MsH is connected to the output terminal 104. The gate signal SGH of the high-side transistor M1 is input to the gate of the high-side detection transistor MsH.

The second resistor R31 is arranged between the second terminal (drain) of the high-side detection transistor MsH and the power supply terminal 107. The ON/OFF operation of the high-side transistor MsH follows the ON/OFF operation of the high-side transistor M1.

The second bypass circuit 22b is arranged in parallel with the second resistor R31. When the control signal SIN is set to a level (high level) which instructs the high-side transistor M1 to switch off, the second bypass circuit 22b is set to the conduction state. When the control signal SIN is set to a level (low level) which instructs the high-side transistor M1 to switch on, the second bypass circuit 22b is set to the cut-off state. A resistor component is arranged on a path of the second bypass circuit 22b, the resistance of which is smaller resistance than that of the second resistor R31.

The second bypass circuit 22b includes a second bypass resistor R32 having a smaller resistance value than that of the second resistor R31, and a second switch Msw2 arranged in series with the second bypass resistor R32, and the ON/OFF state of which is switched according to the inverted control signal #SIN.

A level shifter circuit LS2 level-shifts the inverted control signal #SIN, and applies the signal thus level-shifted to the gate of the second switch Msw2. A level shifter circuit LS3 level-shifts a signal S2', which switches between VCC2 and 0 V, into the high-side off-detection signal S2 which switches between VCC1 and 0 V.

With the high-side off-detection circuit 20 shown in FIG. 6, the voltage level of the gate signal SGH is compared with the second level THH (=VCC1+Vtn), thereby detecting the ON/OFF state of the high-side transistor M1.

With the bridge output circuit 100b shown in FIG. 5, shoot-through current that flows through the high-side transistor M1 and the low-side transistor M2 can be prevented in the same way as with the bridge output circuit 100 shown in FIG. 1.

Furthermore, such an arrangement is capable of reducing the time in which both the transistors are simultaneously off, thereby improving the energy efficiency.

Description has been made regarding an embodiment of the present invention with reference to the first embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made in the embodiment regarding a half-bridge circuit as an example. Also, the present invention can be effectively applied to a full-bridge configuration including two pairs of half-bridge circuits.

For example, the output circuit according to the embodiment can be suitably employed in motor drivers, switching regulators, lighting inverters for discharge lamps, digital audio amplifiers, etc.

Second Embodiment

Figure 8:
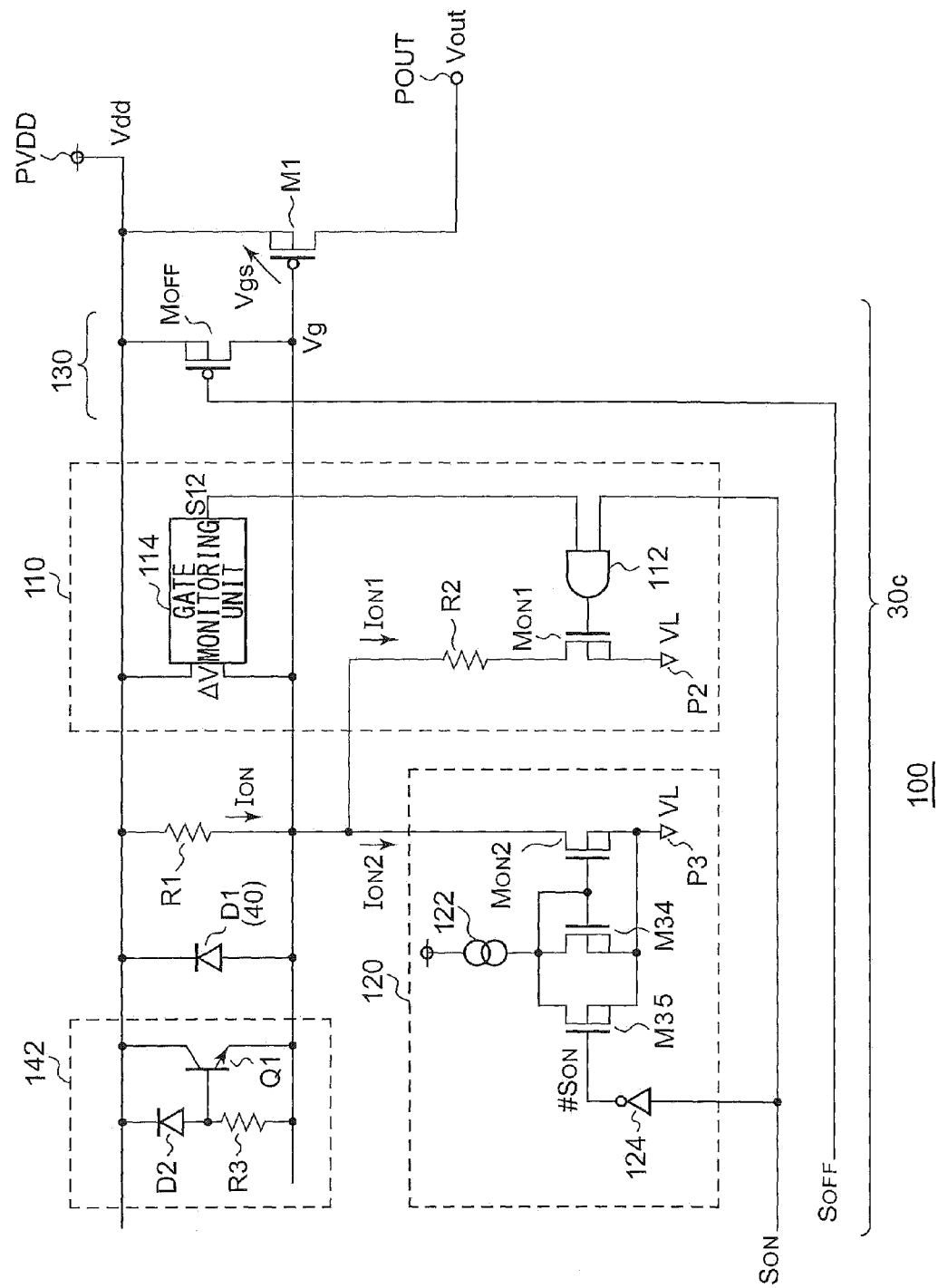
FIG. 8 is a circuit diagram which shows a configuration of an output circuit according to a second embodiment.

FIG. 8 is a circuit diagram which shows a configuration of an output circuit 100 according to a second embodiment. Via its output terminal POUT, the output circuit 100 outputs either the power supply voltage Vdd or another voltage (e.g., ground voltage) that differs from the power supply voltage Vdd, according to the levels of an on-control signal SON and an off-control signal SOFF. The output circuit 100 is a portion of a half-bridge circuit, a portion of an H-bridge circuit, or a portion of a source follower circuit.

The output circuit 100 includes: an output power transistor (which will simply be referred to as the "output transistor" hereafter) M1, a first resistor R1, a first ON circuit 110, a second ON circuit 120, an OFF circuit 130, a first clamp circuit 140, and a second clamp circuit 142. The circuit portion of the bridge output circuit 100, with the exception of the high-side transistor M1, will be referred to as a "high-side driver 30c".

The output transistor M1 is arranged between the output terminal POUT and a first terminal (power supply terminal PVDD) which has a fixed electric potential. The output transistor M1 is configured as a P-channel MOSFET. The source of the output transistor M1 is connected to the power supply terminal PVDD, and the drain thereof is connected to the output terminal POUT.

The OFF circuit 130 is provided in order to provide a function of turning off the output transistor M1. The OFF circuit 130 receives the OFF control signal SOFF which is asserted (set to high level) during a period of time in which the output transistor M1 is to be turned off. The OFF circuit 130 includes an OFF transistor MOFF arranged between the gate and the source of the output transistor M1. When the OFF control signal SOFF is asserted, the OFF transistor MOFF is turned on. In this state, the gate-source voltage of the output transistor M1 becomes smaller than the threshold voltage Vt of the MOSFET, thereby turning off the output transistor M1.

The first resistor R1, the first ON circuit 110, and the second ON circuit 120 form an ON circuit provided in order to provide a function of turning on the output transistor M1. The ON circuit thus formed receive the ON control signal SON which is asserted (set to high level) during a period of time in which the output transistor M1 is to be set to the ON state.

The first resistor R1 is arranged between the gate of the output transistor M1 and the first terminal (power supply terminal PVDD).

The first ON circuit 110 includes a first ON transistor MON1 arranged between the gate of the output transistor M1 and a second terminal P2 which has a fixed electric potential. The current that flows through the first ON transistor MON1 will be referred to as "first current ION1".

The second ON circuit 120 includes a second ON transistor MON2 arranged between the gate of the output transistor M1 and a third terminal which has a fixed electric potential. The second terminal P2 and the third terminal P3 may be set to a common fixed electric potential VL. Also, the second terminal P2 and the third terminal P3 may be set to different electric potentials. For example, the second terminal P2 and the third terminal P3 may each be configured as the ground terminal. The current that flows through the second ON transistor MON2 will be referred to as the "second current ION2".

When the ON control signal SON is asserted, the output circuit 100 instructs each of the first ON transistor MON1 and the second ON transistor MON2 to switch on. Subsequently, the output circuit 100 turns off the first ON transistor MON1.

More specifically, the first ON circuit 110 includes an AND gate 112 and a gate voltage monitoring unit 114, in addition to the first ON transistor MON1.

The gate voltage monitoring unit 114 monitors the voltage difference ΔV between the gate of the output transistor M1 and the first terminal (power supply terminal PVDD), i.e., monitors the gate-source voltage Vgs of the output transistor M1. The gate voltage monitoring unit 114 generates an OFF signal S12 which instructs the first ON transistor MON1 to switch off, according to the monitoring result. When the voltage difference Vgs reaches a predetermined value Vth1, the gate voltage monitoring unit 114 asserts the OFF signal S12 (switches the OFF signal S12 to low level). The gate voltage monitoring unit 114 operates with a delay τ1. With such an arrangement, after the delay τ1 elapses after the gate-source voltage Vgs reaches the threshold voltage Vth1, the OFF signal S12 is asserted. The threshold value Vth1 is optimized giving consideration to the delay τ1.

The AND gate 112 generated the logical AND of the OFF signal S12 and the ON control signal SON, and outputs the logical AND signal thus generated to the gate of the first ON transistor MON1. With such an arrangement, the first ON transistor MON1 can be turned off after both the first ON transistor MON1 and the second ON transistor MON2 are turned on.

The first ON circuit 110 further includes a current limiting resistor R2. The current limiting resistor R2 is arranged on a path of the first ON transistor MON1, i.e., between the drain of the first ON transistor MON1 and the gate of the output transistor M1. By optimizing the resistance value of the current limiting resistor R2, such an arrangement is capable of optimizing the current ION1 that flows through the output transistor M1.

When the ON control signal SON is asserted, the second ON transistor MON2 of the second ON circuit 120 preferably generates a predetermined constant current ION2.

The second ON circuit 120 includes transistors M34 and M35, a constant current source 122, and an inverter 124. The constant current source 122 generates a constant current Ic. The transistor M34 is configured as a MOSFET that is of the same conduction type (N-channel MOSFET) as the second ON transistor MON2. The transistor M34 is arranged on a path for the constant current Ic. The transistor M34 and the second ON transistor MON2 form a current mirror circuit.

Such an arrangement generates a second current ION2 obtained by multiplying the constant current Ic by k (k represents the mirror ratio).

In order to control the on and off operations of the second ON transistor MON2, the transistor M35 is arranged between the gate and the source of the second ON transistor MON2. The ON control signal #SON ("#" represents logical inversion), after being inverted by the inverter 124, is input to the gate of the transistor M35. When the ON control signal SON is asserted (set to high level), the transistor M35 is turned off, and the second ON transistor MON2 is turned on, thereby generating the second current ION2. When the ON control signal SON is negated (set to low level), the transistor M35 is turned on, and the second ON transistor MON2 is turned off, thereby cutting off the second current ION2.

The first clamp circuit 140 clamps the voltage difference between the gate of the output transistor M1 and the first terminal PVDD to a predetermined clamp value VCL1. The first clamp circuit 140 includes a reverse-connected diode D1 between the gate and the source of the output transistor M1. The predetermined value VCL is equal to the Zener voltage Vz of the diode D1.

The second clamp circuit 142 includes a bipolar transistor Q1 arranged between the gate and the source of the output transistor M1, a resistor R3 arranged between the base and the emitter of the transistor Q1, and a diode D2 reverse-connected between the base and the collector of the transistor Q1. The second clamp circuit 142 clamps the gate-source voltage Vgs to a predetermined clamp value VCL2.

With the present embodiment, the relation VCL1<VCL2 is satisfied. The first clamp value VCL1 is preferably set to a value which is smaller than the maximum operating voltage of the gate-source voltage of the output transistor M1. Furthermore, the second clamp value VCL2 is preferably set to a value which is smaller than the absolute maximum rating voltage of the gate-source voltage Vgs of the output transistor M1.

Figure 9:
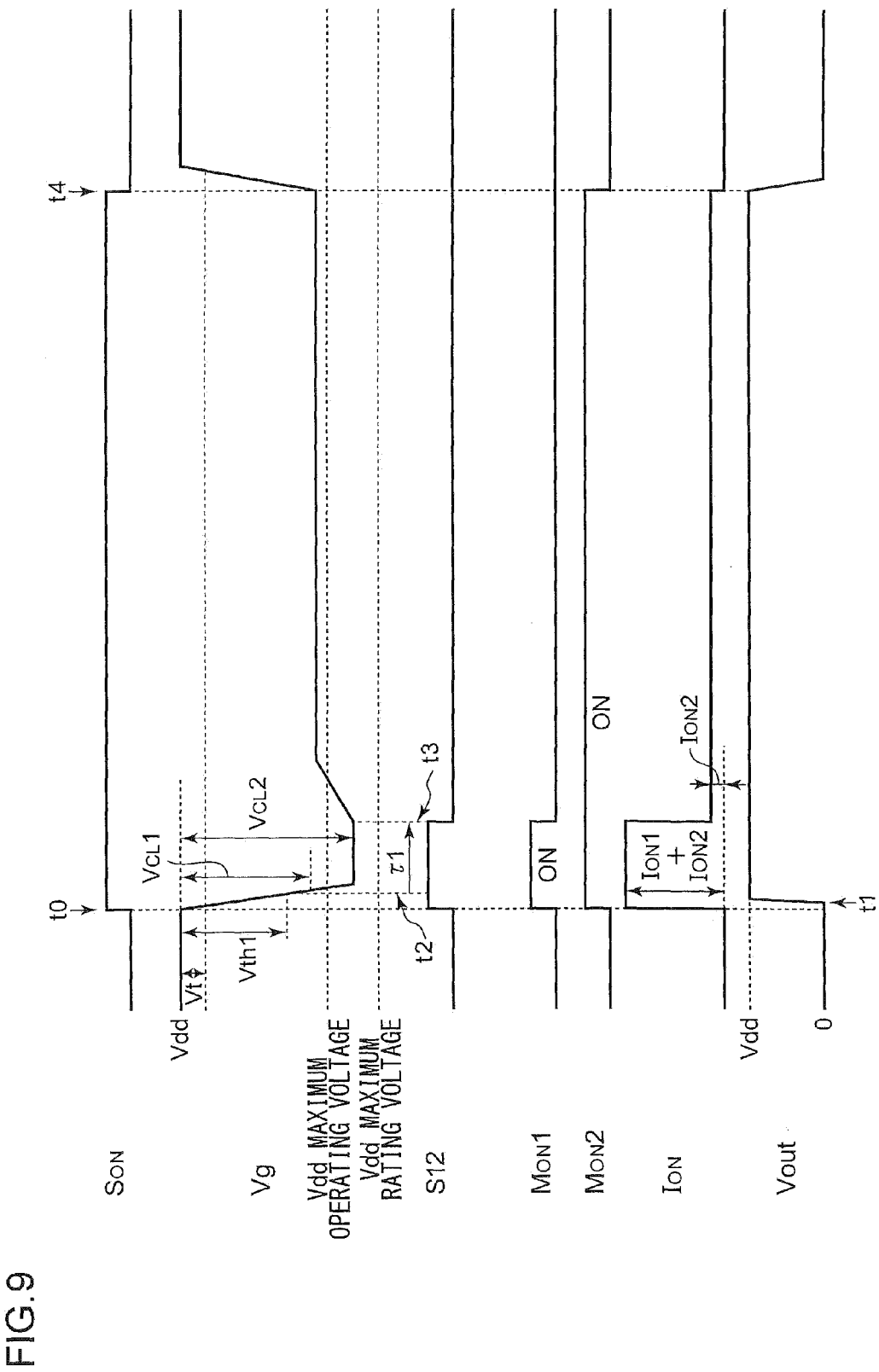
FIG. 9 is a time chart which shows the operation of the output circuit shown in FIG. 8.

The above is the configuration of the output circuit 100. Next, description will be made regarding the operation thereof. FIG. 9 is a time chart which shows the operation of the output circuit 100 shown in FIG. 8.

At the time point t0, the ON control signal SON is asserted (set to high level), which instructs the output transistor M1 to switch on. Upon receiving this instruction, both the first ON transistor MON1 and the second ON transistor MON2 are turned on. In this state, the current ION=ION1+ION2 flows through the first resistor R1.

The voltage drop Vgs that occurs at the first resistor R1 is represented by the following Expression. The gate voltage Vg of the output transistor M1 rapidly drops.

$$Vgs = R1 \times (ION1 + ION2)$$

At the time point t1, the gate-source voltage Vgs exceeds the threshold voltage Vt of the output transistor M1, whereby the output transistor M1 switches on.

Subsequently, at the time point t2, the gate-source voltage Vgs reaches the threshold voltage Vth1 set by the gate voltage monitoring unit 114. Subsequently, after the delay τ1 elapses, at the time point t3, the OFF signal S12 is asserted (set to low level).

In the period of time from the time point t2 to the time point t3, as the gate voltage Vg drops, the first clamp circuit 140 and the second clamp circuit 142 operate, in this order. Thus, the gate voltage Vg is held at a level equal to (Vdd−VCL2).

When the OFF signal S12 is asserted at the time point t3, the first ON transistor MON1 switches off, and accordingly, the current ION that flows through the first resistor R1 becomes equal to the second current ION2. As a result, the voltage drop that occurs at the first resistor R1 becomes small. This gradually raises the gate voltage Vg of the output transistor M1.

When the ON control signal SON is negated (set to low level) at the time point t4, the second ON transistor MON2 is turned off. As a result, the voltage drop that occurs at the first resistor R1 becomes substantially zero, thereby turning off the output transistor M1.

The above is the operation of the output circuit 100.

With the output circuit 100, immediately after the output transistor M1 is instructed to switch on, the two ON circuits 110 and 120 are set to the active state. This rapidly reduces the gate voltage Vg of the output transistor M1, thereby enabling the output transistor M1 to switch on at high speed.

Furthermore, by setting the first ON circuit 110 to the inactive state after the output transistor M1 switches on, such an arrangement provides reduced power consumption. Furthermore, with such an arrangement, the gate-source voltage Vgs of the output transistor M1 can be set to a voltage which is lower than the maximum operating voltage thereof, thereby providing improved reliability.

Figure 10:
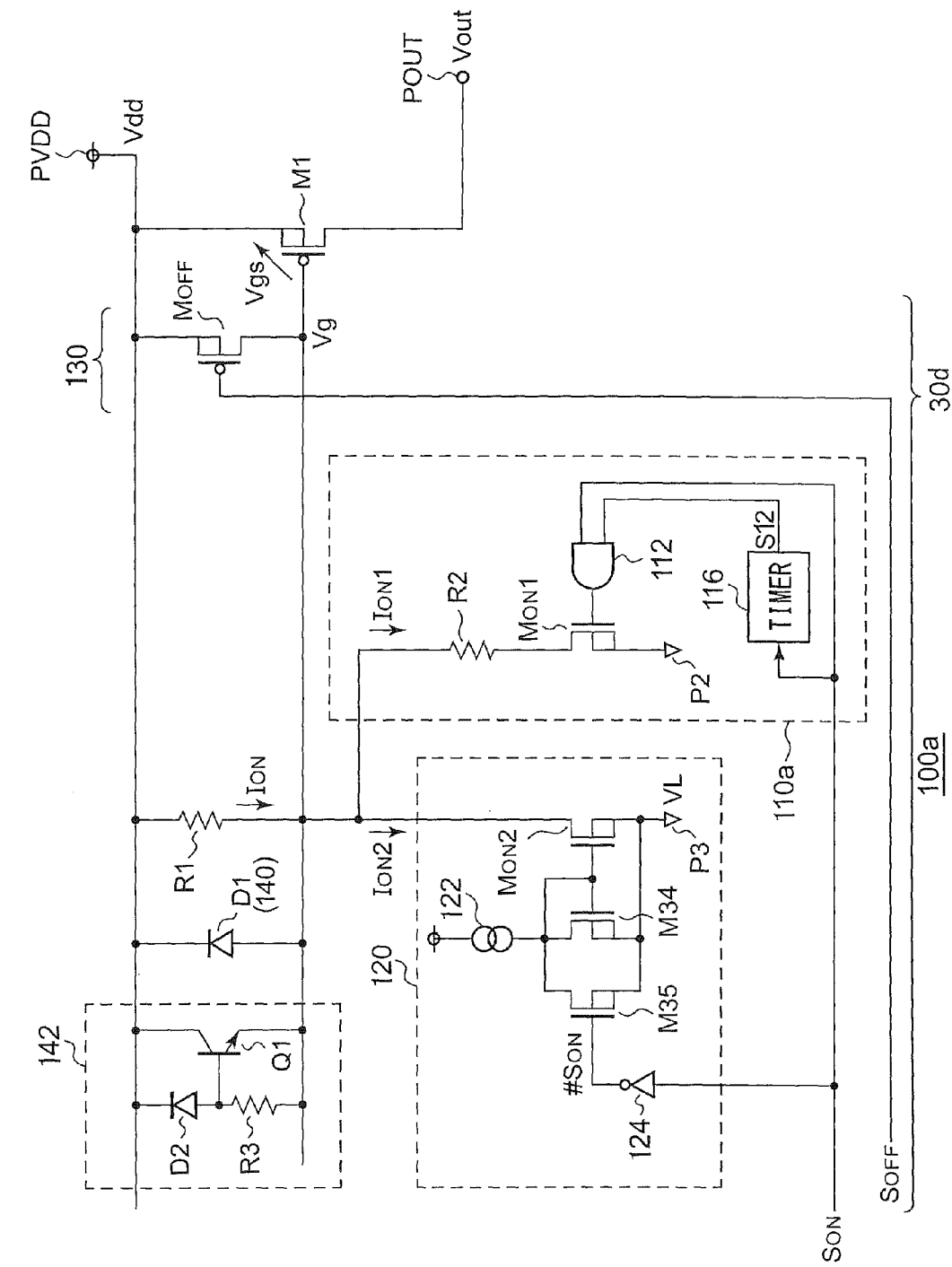
FIG. 10 is a circuit diagram which shows a configuration of an output circuit according to a modification.

FIG. 10 is a circuit diagram which shows a configuration of the output circuit according to a modification. An output circuit 100a shown in FIG. 10 has the same configuration as that of the output circuit 100 shown in FIG. 8, except for a first ON circuit 110a. The circuit configuration of the output circuit 100a, with the exception of the high-side transistor M1, will be referred to "high-side driver 30d".

The first ON circuit 110a includes a delay circuit 116, instead of the gate voltage monitoring unit 114 shown in FIG. 8. The delay circuit 116 generates an OFF signal S12 which is asserted (set to low level) after a predetermined period of time τ2 elapses after the ON control signal SON is asserted. For example, the delay circuit 116 may be configured as an analog timer or a digital timer. Alternatively, the delay circuit 116 and the AND gate 112 may be configured as a one-shot pulse circuit. The one-shot pulse circuit is a circuit configured to generate a pulse which is set to high level (or low level) for a predetermined period of time.

The output circuit 100a according to such a modification shown in FIG. 10 operates in the same way as shown in the time chart shown in FIG. 9. Thus, the output circuit 100a according to the modification provides the same advantages as those of the output circuit 100 shown in FIG. 8.

Description has been made regarding an embodiment of the present invention with reference to the second embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made in the embodiment regarding an arrangement in which a P-channel MOSFET is employed as the output transistor M1 of the high-side block. Also, the present invention may be applied to an arrangement employing an N-channel MOSFET. Also, the present invention can be effectively applied so as to prevent a malfunction of a power transistor in the low-side block in a half-bridge configuration or a full-bridge configuration.

In the configuration shown in FIG. 8 or FIG. 10, there is not necessarily a need to provide the first clamp circuit 140 or the second clamp circuit 142. In a case in which the breakdown voltage of the output transistor is sufficiently high, either one or both of the first clamp circuit 140 and the second clamp circuit 142 may be eliminated.

For example, the output circuit 100 according to the second embodiment can be suitably employed in motor drivers, switching regulators, lighting inverters for discharge lamps, etc.

Also, a combination of the first embodiment and the second embodiment is also valid as an embodiment of the present invention. That is to say, the high-side driver 30*c* shown in FIG. 8 or the high-side driver 30*d* shown in FIG. 10 may be employed as the high-side driver 30 included in the bridge output circuit 100 shown in FIG. 1. It is needless to say that a portion of the configuration of the high-side driver 30*c* or 30*d* (e.g., the first clamp circuit 140, second clamp circuit 142) may be eliminated.

In this case, the transistor M3 shown in FIG. 1 is replaced by the OFF transistor MOFF shown in FIG. 8 or FIG. 10. With such an arrangement, the same signal as the signal output to the gate of the transistor M3 from the low-side driver 40 is input to the gate of the OFF transistor MOFF thus arranged. The ON control signal SON corresponds to the input signal SIN shown in FIG. 1. Furthermore, the inverter 124 shown in FIG. 8 or FIG. 10 is replaced by the NAND gate 32 shown in FIG. 1.

Such a combination arrangement provides the advantages of both the first embodiment and the second embodiment.

While the preferred embodiments of the present invention have been described using specific terms, such description is for illustrative purposes only, and it is to be understood that changes and variations may be made without departing from the spirit or scope of the appended claims.

What is claimed is:

1. An output circuit configured to output, via an output terminal thereof, a voltage that corresponds to a control signal, the output circuit comprising:
    an output transistor arranged between the output terminal and a first terminal which has a first fixed electric potential;
    a first resistor arranged between a gate of the output transistor and the first terminal;
    a first ON circuit including a first ON transistor arranged between the gate of the output transistor and a second terminal which has a second fixed electric potential; and
    a second ON circuit including a second ON transistor arranged between the gate of the output transistor and a third terminal which has a third fixed electric potential,
    wherein, when an ON control signal, which instructs the output transistor to switch on, is asserted, both the first and second ON transistors are turned on, following which the first ON transistor is turned off.

2. An output circuit according to claim 1, wherein the first ON circuit comprises a gate voltage monitoring unit configured to monitor the voltage difference between the gate of the output transistor and the first terminal, and to generate an OFF control signal which is asserted when the voltage difference thus monitored reaches a predetermined value, thereby turning off the first ON transistor,
    and wherein the first ON transistor is controlled according to the ON control signal and the OFF control signal.

3. An output circuit according to claim 1, wherein the first ON circuit comprises a delay circuit configured to generate an OFF control signal which is asserted after a predetermined period of time elapses after the ON control signal is asserted,
    and wherein the first ON transistor is controlled according to the ON control signal and the OFF control signal.

4. An output circuit according to claim 1, wherein the first ON circuit comprises a second resistor arranged in series with the first ON transistor.

5. An output circuit according to claim 1, wherein the second ON transistor is configured to generate a predetermined constant current when the ON control signal is asserted.

6. An output circuit according to claim 1, further comprising a clamp circuit configured to clamp the voltage difference between the gate of the output transistor and the first terminal to a predetermined value.

\* \* \* \* \*